(12) United States Patent
Popinciuc et al.

(10) Patent No.: US 12,742,636 B2
(45) Date of Patent: Sep. 22, 2026

(54) HEIGHT MEASUREMENT SENSOR USING DERIVATIVE OF PERIODIC POINTS

(71) Applicant: ASML Netherlands B.V., Veldhoven (NL)

(72) Inventors: Mihaita Popinciuc, Eindhoven (NL); Thomas Per Krister Martinsson, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 190 days.

(21) Appl. No.: 18/838,148

(22) PCT Filed: Feb. 1, 2023

(86) PCT No.: PCT/EP2023/052368
§ 371 (c)(1),
(2) Date: Aug. 13, 2024

(87) PCT Pub. No.: WO2023/160972
PCT Pub. Date: Aug. 31, 2023

(65) Prior Publication Data

US 2025/0146806 A1 May 8, 2025

(30) Foreign Application Priority Data

Feb. 28, 2022 (EP) .................................... 22159153

(51) Int. Cl.
*G03F 9/00* (2006.01)
*G01B 11/06* (2006.01)

(52) U.S. Cl.
CPC ........ *G01B 11/0608* (2013.01); *G03F 9/7049* (2013.01); *G03F 9/7092* (2013.01); *G01B 2210/56* (2013.01)

(58) Field of Classification Search
CPC ....................... G01B 11/0608; G01B 2210/56; G01B 21/08; G03F 9/7049; G03F 9/7092; G03F 9/7034
See application file for complete search history.

(56) References Cited

U.S. PATENT DOCUMENTS 6,952,253 B2 10/2005 Lof et al.
9,175,951 B2 11/2015 El Gawhary et al.
(Continued)

FOREIGN PATENT DOCUMENTS

CN 113557549 A 10/2021
CN 113994265 A 1/2022
(Continued)

OTHER PUBLICATIONS

International Search Report and Written Opinion of the International Searching Authority directed to International Patent Application No. PCT/EP2023/052368, mailed May 8, 2023; 9 pages.

*Primary Examiner* — Rebecca C Bryant
(74) *Attorney, Agent, or Firm* — Pillsbury Winthrop Shaw Pittman, LLP

(57) ABSTRACT

A height measurement sensor comprising projection and detection units. The projection unit comprises a radiation source and a projection grating comprising a projection grating spot having a plurality of grating lines, the projection grating arranged to receive radiation and output a radiation beam onto the surface to create a radiation spot. The detection unit comprises: a detection grating comprising a detection grating spot having a plurality of grating lines; a detector arranged to receive a reflected radiation beam comprising radiation from the radiation spot after passing through the detection grating spot; and a controller configured to (i) obtain a detector output signal comprising a plurality of periodic components; (ii) take a derivative of two points at different locations of the output signal, wherein
(Continued)

the two points are separated by a period of the periodic components, and (iii) determine a focus plane of the sensor when the derivative changes sign.

17 Claims, 8 Drawing Sheets

(56) References Cited

U.S. PATENT DOCUMENTS

| | | | |
|---|---|---|---|
| 10,571,363 | B2 | 2/2020 | Medvedyeva et al. |
| 11,906,906 | B2 | 2/2024 | Goorden et al. |
| 11,908,156 | B2 | 2/2024 | Eberspach et al. |
| 11,982,948 | B2 | 5/2024 | Popinciuc |
| 2005/0030507 | A1 | 2/2005 | Teunissen et al. |
| 2011/0164229 | A1 | 7/2011 | Staals et al. |
| 2014/0362359 | A1 | 12/2014 | Chao et al. |
| 2019/0049864 | A1 | 2/2019 | Hugers et al. |
| 2020/0057390 | A1 | 2/2020 | Butler et al. |
| 2020/0264521 | A1 | 8/2020 | Scholtes-Van Eijk et al. |

FOREIGN PATENT DOCUMENTS

| | | | |
|---|---|---|---|
| TW | 2013-03259 | A | 1/2013 |
| TW | 2019-40987 | A | 10/2019 |
| TW | 2021-05079 | A | 2/2021 |
| WO | WO 2017/153069 | A1 | 9/2017 |

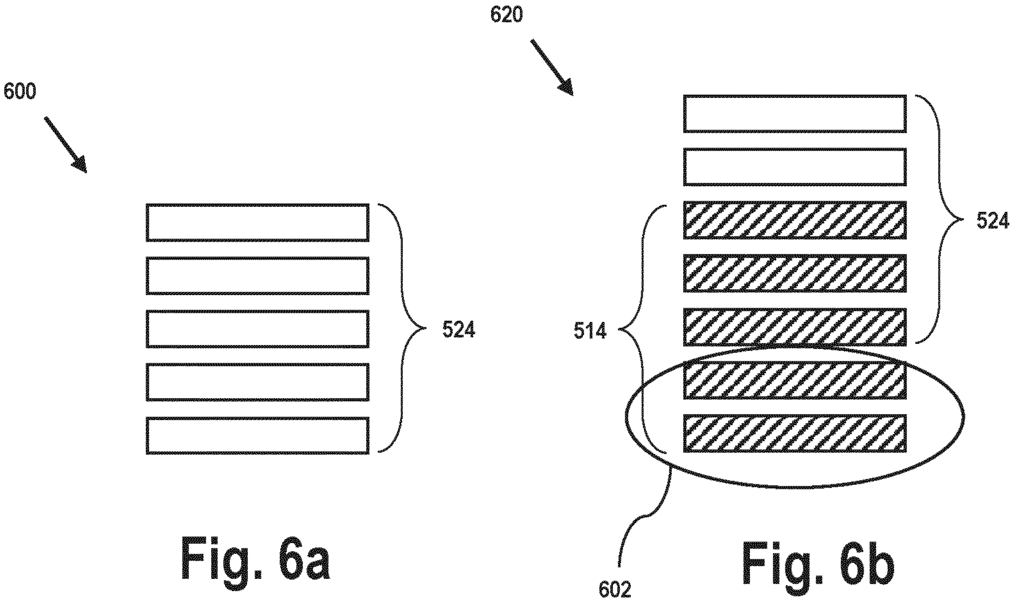
Fig. 6a
Fig. 6b
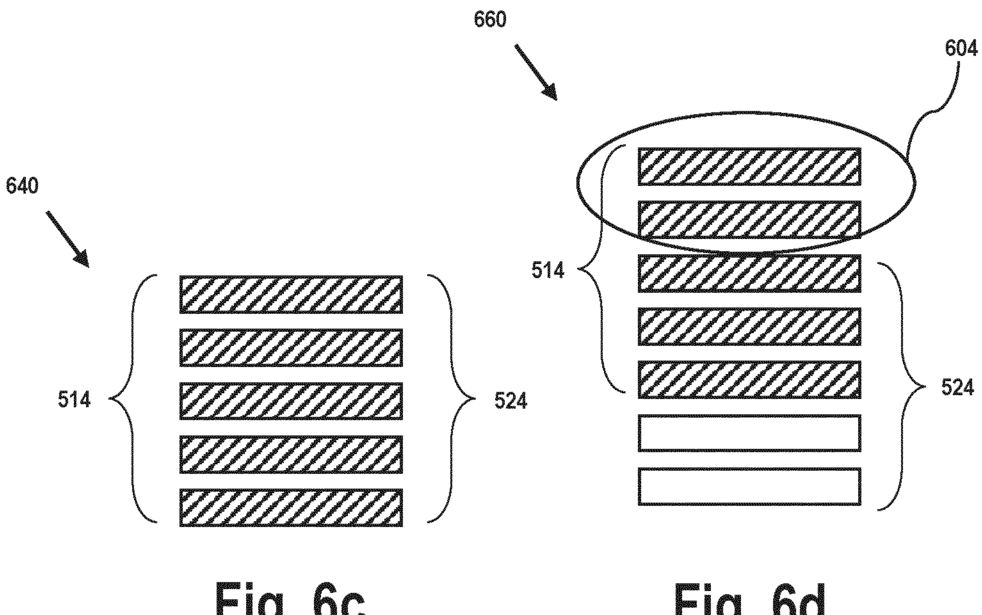
Fig. 6c
Fig. 6d

HEIGHT MEASUREMENT SENSOR USING DERIVATIVE OF PERIODIC POINTS

CROSS-REFERENCE TO RELATED APPLICATION

The application claims priority of European patent application 22159153.0 which was filed on 28 Feb. 2022 and which is incorporated herein in its entirety by reference.

FIELD

The present invention relates to a height measurement sensor, in particular a height measurement sensor for a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such a process, the resolution formula may be expressed as $CD=k_1\times\lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but are not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low $k_1$.

In general, the surface of a substrate on which a pattern should be projected is not completely flat. Moreover, a substrate can show thickness variation of several microns. This unflatness and/or thickness variation of the substrate surface may result in incorrect projection of the pattern, for instance due to focus errors or imaging errors. To correct for unflatness and/or thickness variation of a substrate, it is known to use a height sensor (sometimes referred to as a level sensor), desirably integrated in the lithographic apparatus. Such a height sensor may be used to determine a height map of a substrate, before a pattern is transferred, e.g., projected, on the substrate. This height map may subsequently be used to correct the position of the substrate during transfer of the pattern on the substrate, in order to maintain an aerial image of the patterning device in proper focus. It will be understood that "height" in this context refers to a dimension broadly out of the plane to the substrate, and does not imply any particular orientation with respect to Earth or gravity.

A topography measurement system, level sensor or height sensor, is arranged to measure a topography of a top surface of a substrate (or wafer). A map of the topography of the substrate, also referred to as height map, may be generated from these measurements indicating a height of the substrate as a function of the position on the substrate. This height map may subsequently be used to correct the position of the substrate during transfer of the pattern on the substrate, in order to provide an aerial image of the patterning device in a properly focus position on the substrate. It will be understood that "height" in this context refers to a dimension broadly out of the plane to the substrate (also referred to as Z-axis). Typically, the level or height sensor performs measurements at a fixed location (relative to its own optical system) and a relative movement between the substrate and the optical system of the level or height sensor results in height measurements at locations across the substrate.

Typically, such a height sensor comprises a projection unit comprising: a projection grating comprising an elongate grating, which may be divided into a series of "spots" (each otherwise referred to herein as a projection grating spot), with grating lines parallel to its axis, each projection grating spot arranged to output a separate/discrete measurement spot (MS) radiation beam onto a surface of the substrate to form a measurement spot, and an additional aperture comprising a single grating line arranged to output a capture spot (CS) radiation beam to form a capture spot located ahead of the array of measurement spots on the substrate surface. The height sensor also typically comprises a detection unit comprising a first detector to receive the measurement spot radiation beam after reflection on the substrate, and a second detector to receive the capture spot radiation beam after reflection on the substrate. A processing unit calculates a height level on the basis of the measurement spot radiation beam received by the detector. A change in the surface height results in a shift of the detected image.

SUMMARY

In the known height sensor referred to above, at the detector the (MS) radiation beam is split into two branches. The light in the two branches is detected by photodiodes. The projection grating image shift is measured by the imbalance in the two branches (AC signal) divided by total intensity detected in the two branches (DC signal). In a first order approximation we have:

$$Z_{MS}=\text{gain}_{MS}*\text{AC}_{MS}/\text{DC}_{MS},$$

where $\text{gain}_{MS}$ is calibrated.

The normalization of the AC signal by the DC signal (Zraw=AC/DC) makes the height sensor response independent of the surface reflectivity and it enables accurate calibration. However, the normalization makes the $Zraw_{MS}$ signal periodic as a function of the height of the substrate. The substrate may be a wafer supported by a wafer stage (WS). Accurate calibration and accurate height measurements are done only in the center/correct period, this is when the full projection grating image (the MS radiation beam) is detected by the detection grating.

The measurement spots are positioned in the correct period by performing a capture scan. The capture spot height measurement is similar to the measurement spots:

$$Z_{CS} = \text{gain}_{CS} * AC_{CS}/DC_{CS}.$$

During the capture scan, the wafer stage scans a certain range around the expected MS correct period and both MS and CS signals are recorded. The capture signal is not periodic (since the capture spot consists of a single slit) and an algorithm is used to detect the capture position. This is the position where $Zraw_{CS}=0$ ($AC_{CS}=0$), which identifies the MS correct period by design.

The capture spot zero crossing is by design very close to the measure spot zero crossing in the correct period. The inventors have identified that due to interaction with local topography on the substrate and the process layer stack at the CS and MS positions, the signals can be distorted significantly. In the example whereby the substrate is a wafer, the process layer stack comprises a series of layers of the wafer with different transparencies. Local variation of the transparency can occur due to the structures being printed on the wafers (e.g. memory cells, transistors, metal lines etc.). As a consequence of such signal distortion, the CS and MS zero crossings shift significantly. This results in the capture algorithm failing to identify the correct MS period.

In embodiments of the invention, only the MS signal is used to identify the correct period, thus no capture spot is required.

According to one aspect of the present disclosure there is provided a height measurement sensor for measuring a position of a surface of a substrate comprising:

- a projection unit, wherein the projection unit comprises:
  - a radiation source;
  - a projection grating comprising a projection grating spot, the projection grating spot comprising a plurality of projection grating lines, the projection grating arranged to receive radiation emitted by the radiation source and output a radiation beam onto the surface to create a radiation spot on the surface, the radiation spot comprising a plurality of radiation lines; and
- a detection unit, wherein the detection unit comprises:
  - a detection grating, wherein the detection grating comprises a detection grating spot, the detection grating spot comprising a plurality of detection grating lines;
  - a detector arranged to receive a reflected radiation beam comprising radiation from the radiation spot reflected from the surface after passing through the detection grating spot; and
  - a controller configured to (i) obtain an output signal of the detector, wherein the output signal comprises a plurality of periodic components; (ii) take a derivative of two points at different locations of the output signal, wherein the two points are separated by a period of the periodic components, and (iii) determine when the substrate is positioned at a focus plane of the height measurement sensor when the derivative changes sign.

Thus embodiments of the present invention ensures that the focus plane of the height measurement sensor can be reliably and accurately detected. As a result of the projection grating not requiring a capture spot, the projection grating can be made smaller. The detection grating does not require a detection grating spot for passing a capture spot radiation beam reflected from the surface of the substrate, and thus the detection grating can also be made smaller. Furthermore, the detection unit is simplified in that a separate detector for sensing a capture spot radiation beam is not required.

The projection grating spot may have a total number of projection grating lines, and the detection grating spot may have said total number of detection grating lines.

In some implementations, the projection grating comprises a plurality of projection grating spots, each of the plurality of projection grating spots comprising a plurality of projection grating lines, and the projection grating outputs the radiation beam to create a plurality of radiation spots on the surface, each of the plurality of radiation spots comprising a plurality of radiation lines.

The detection grating may comprise a plurality of detection grating spots, each of the plurality of detection grating spots comprising a plurality of detection grating lines.

The controller may be configured to control a height of the substrate relative to a reference height in a direction perpendicular to the surface of the substrate during a time window in which the output signal is obtained.

The controller may be able to control the height of the substrate relative to the reference height within a height range, and the controller may be configured, during said time window, to control the height of the substrate relative to the reference height within a sub-portion of said height range. Taking an example whereby the substrate is a wafer supported by a wafer stage (WS) of a lithographic apparatus, for throughput reasons, the wafer stage may not scan its full height range when determining the focus plane and instead scans a smaller height range to save time. If the full height range will be scanned, it is possible to identify the focus plane of the height measurement sensor when the maximum output signal from the detector is detected. When a smaller height range is scanned this is not possible. By looking at the derivative of the output signal and identifying the point at which the derivative of the output signal is zero, it is possible to guarantee that the true maximum is detected because the monotonicity of the output signal is changing at the true maximum.

The controller may be configured to move the substrate in a direction perpendicular to the plurality of radiation lines during the time window in which the output signal is obtained. That is, the substrate may be shifted in the y-direction whilst scanning in the z-direction (the substrate being raised) so that the same area on the substrate is illuminated (the substrate is scanned diagonally). This improves the robustness of the method to determine the focus plane of the height measurement sensor by compensating for light moving on the substrate by making the method robust against reflectivity variations between the projection grating lines of a projection grating spot.

In some implementations, at the focus plane of the height measurement sensor, all of the plurality of radiation lines of the radiation spot created by the projection grating are detected by the detector.

The detector may comprise an optical sensor (e.g. a photodiode) for sensing the reflected radiation beam passing through the detection grating spot.

The period of the periodic components may be dependent on an angle of incidence of the radiation beam and a periodicity of the projection grating lines.

The radiation emitted by the radiation source may have a wavelength in the range of 600 nm-1050 nm.

Alternatively, the radiation emitted by the radiation source may have a wavelength in the range of 100 nm-400 nm.

According to another aspect of the present disclosure there is provided a lithographic apparatus comprising the height measurement sensor according to any of the embodiments described herein.

According to another aspect of the present disclosure there is provided an assessment system comprising the height measurement sensor according to any of the embodiments described herein.

According to another aspect of the present disclosure there is provided a metrology system comprising the height measurement sensor according to any of the embodiments described herein.

According to another aspect of the present disclosure there is provided a method for determining a focus plane of a height measurement sensor, the method comprising:

emitting, with a radiation source of the height measurement sensor, radiation onto a projection grating of the height measurement sensor, the projection grating comprising a projection grating spot, the projection grating spot comprising a plurality of projection grating lines, the projection grating arranged to output a radiation beam onto a surface of a substrate to create a radiation spot on the surface, the radiation spot comprising a plurality of radiation lines;

receiving, with a detector of the height measurement sensor, a reflected radiation beam comprising radiation from the radiation spot reflected from the surface after passing through a detection grating spot of a detection grating, the detection grating spot comprising a plurality of detection grating lines; and a controller of the height measurement sensor (i) obtaining an output signal of the detector, wherein the output signal comprises a plurality of periodic components; (ii) taking a derivative of two points at different locations of the output signal, wherein the two points are separated by a period of the periodic components, and (iii) determining the focus plane of the height measurement sensor when the derivative changes sign.

BRIEF DESCRIPTION OF THE DRAWINGS

Embodiments of the invention will now be described, by way of example only, with reference to the accompanying schematic drawings, in which:

FIGS. 6*a-d* illustrate how sensed reflected radiation varies as the substrate is moved upwards;

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
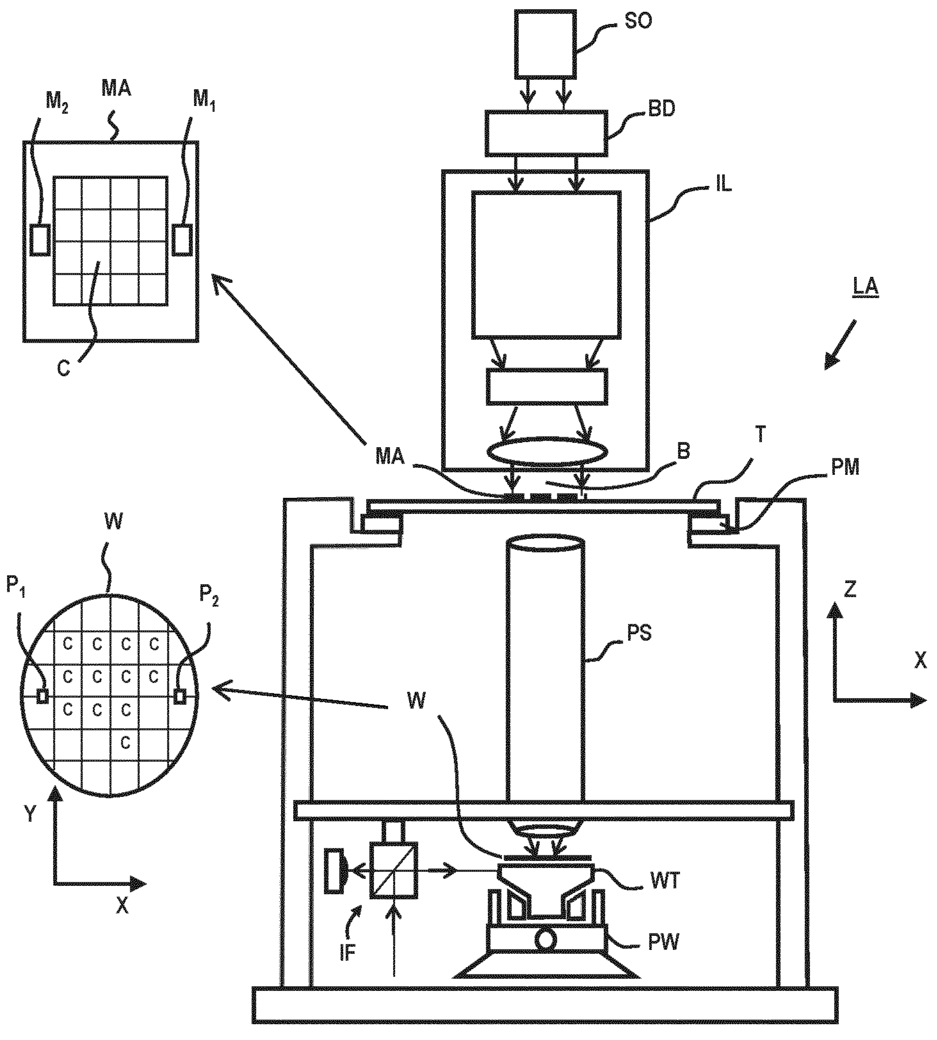
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W-which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such a "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
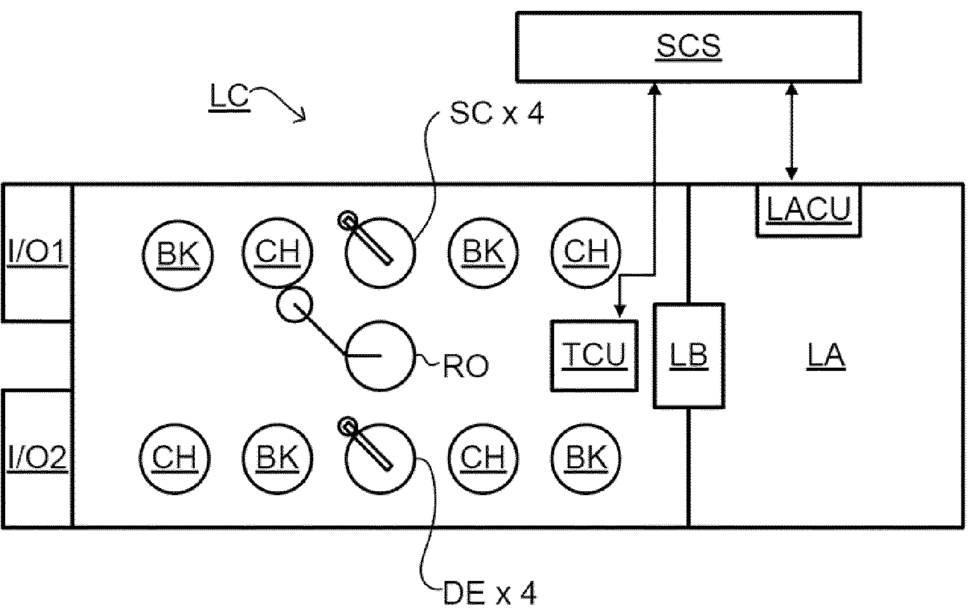
FIG. 2 depicts a schematic overview of a lithographic cell.

As shown in FIG. 2 the lithographic apparatus LA may form part of a lithographic cell LC, also sometimes referred to as a lithocell or (litho) cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus or an assessment apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
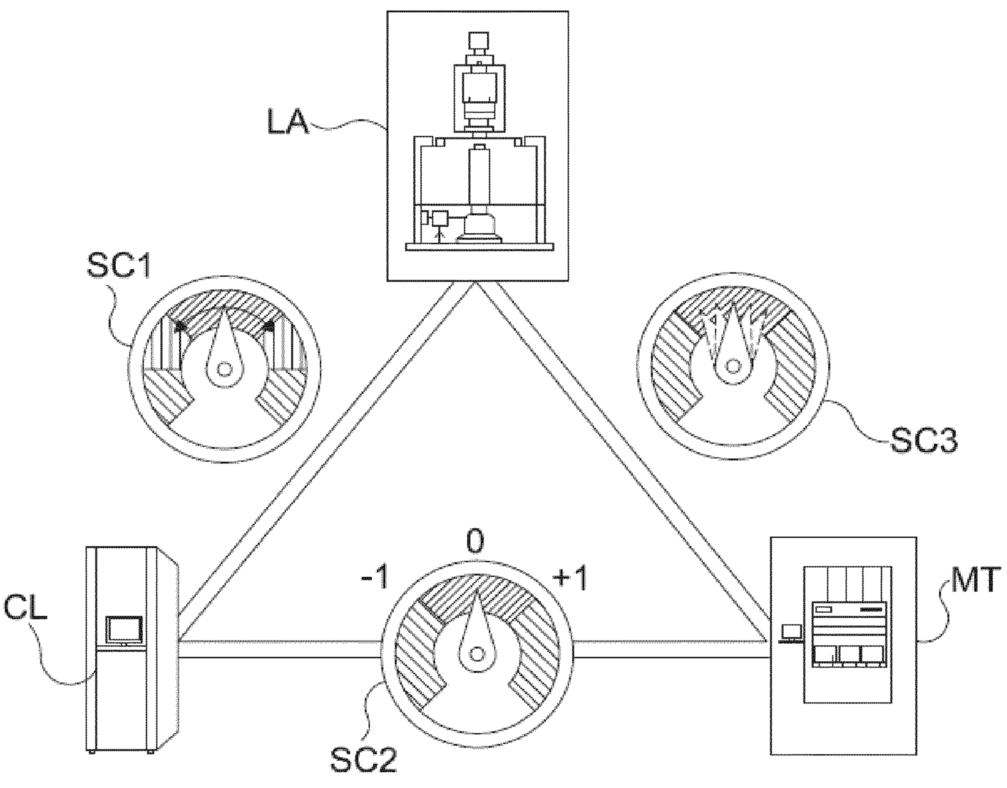
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

Figure 4:
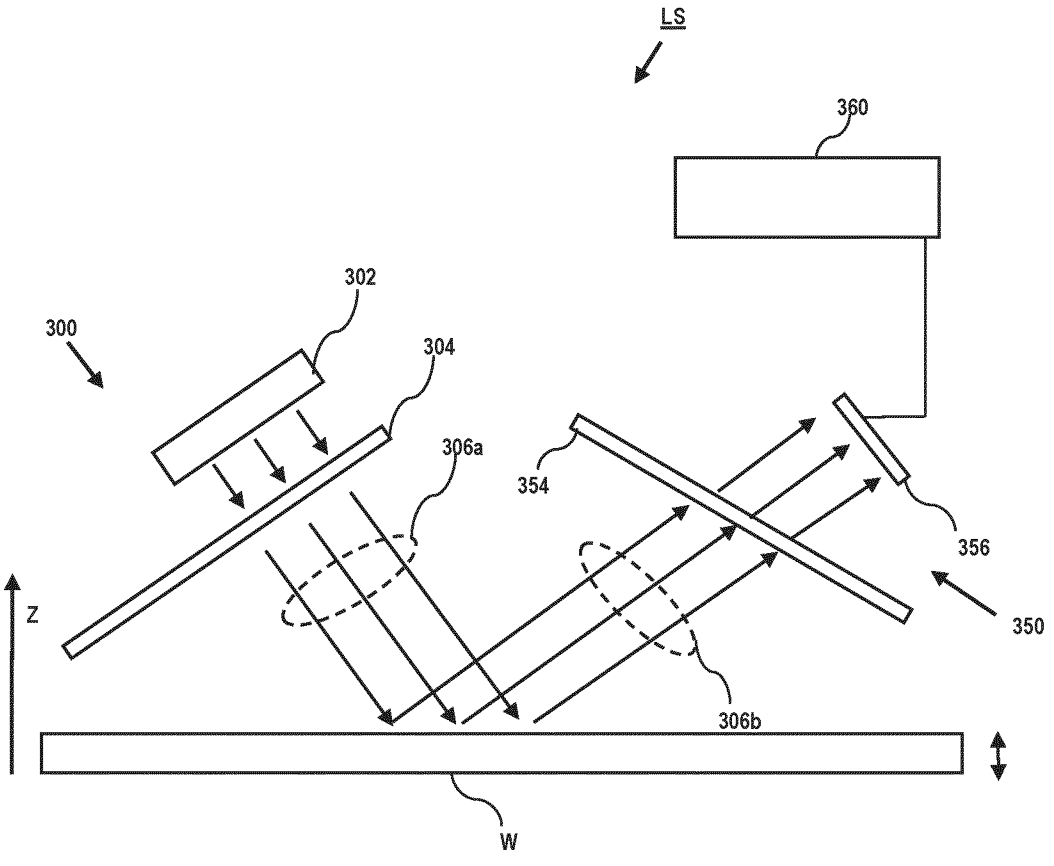
FIG. 4 illustrates a height measurement sensor.

FIG. 4 illustrates a level sensor LS (also referred to herein as height measurement sensor) according to embodiments of the present invention. The level sensor LS comprises a projection unit 300, and a detection unit 350.

The projection unit 300 comprises a radiation source 302 and a projection grating 304. The radiation source 302 may be, for example, a narrowband or broadband radiation source, such as a supercontinuum light source, polarized or non-polarized, pulsed or continuous, such as a polarized or non-polarized laser beam. The radiation source 302 may include a plurality of radiation sources having different colors, or wavelength ranges, such as a plurality of LEDs. The radiation source 302 of the level sensor LS is not restricted to visible radiation, but may additionally or alternatively encompass UV and/or IR radiation and any range of wavelengths suitable to reflect from a surface of a substrate. In one example, the radiation emitted by the radiation source 302 has a wavelength in the range of 600 nm-1050 nm. In another example, the radiation emitted by the radiation source 302 has a wavelength in the range of 100 nm-400 nm.

The projection grating 304 is arranged to receive radiation emitted by the radiation source 302. The projection grating 304 comprises one or more projection grating spots, each of the projection grating spots having a plurality of projection grating lines. The projection grating lines allow radiation emitted by the radiation source 302 to pass through the projection grating 304, resulting in a beam of radiation with a periodically varying intensity. The beam of radiation with the periodically varying intensity is directed towards a measurement location on a surface of a substrate (e.g. a wafer) W. In contrast to known techniques, the projection grating 304 does not have any capture spot.

FIG. 4 illustrates a projection grating 304 comprising a single projection grating spot having three projection grating lines which pass a radiation beam **306*a* towards the surface of the substrate W. It will be appreciated that three projection grating lines is merely an example and a projection grating spot can have two or more projection grating lines. Furthermore the projection grating 304** may comprise multiple projection grating spots each having a plurality of projection grating lines which pass a respective radiation beam towards the surface of the substrate W (thus illuminating different areas on the surface of the substrate).

Figure 5A:
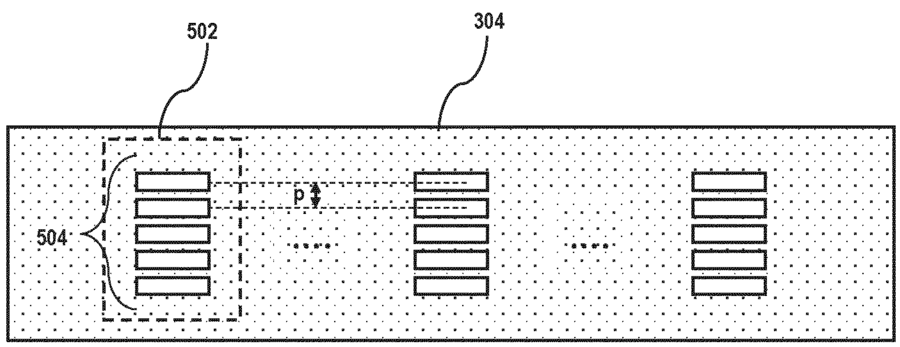
FIG. 5*a* illustrates an example projection grating.

FIG. **5*a* illustrates an example projection grating 304. In the example shown in FIG. 5*a*, the projection grating 304 comprises three projection grating spots 502. Each of the three projection grating spots comprise five projection grating lines 504 through which radiation from the radiation source 302** can pass. The five projection grating lines are separated by a pitch "p" which defines the periodicity of the projection grating lines.

As shown in FIG. 4, the radiation beam **306*a* is directed towards the surface of the substrate W. The radiation beam 306*a* may have an angle of incidence with respect to an axis perpendicular (Z-axis) to the incident substrate surface that is greater than 0 degrees and less than 90 degrees, typically the angle of incidence is between 70 degrees and 80 degrees (inclusive). As mere examples, the angle of incidence may be 70 degrees or 78 degrees. In practice, the level sensor LS will typically include further optical elements along the path between the projection grating 304 and the substrate W. These further optical elements have been omitted from FIG. 4** for ease of illustration.

When the radiation beam **306*a* is incident on the surface of the substrate W at the measurement location, a radiation spot is created, this is an area on the surface of the substrate W which is illuminated by the radiation source 302**. The radiation spot comprises a plurality of radiation lines corresponding to the plurality of grating lines of the projection grating spot.

Figure 5B:
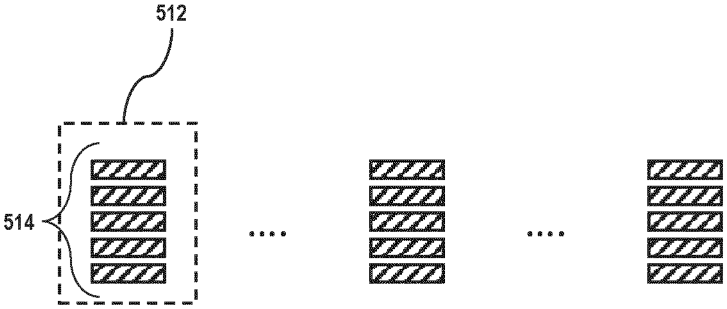
FIG. 5*b* illustrates radiation spots created on the surface of a substrate.

FIG. **5*b* illustrates three radiation spots 512 each comprising five radiation lines 514 corresponding to the five projection grating lines 504 that would be created on the surface of the substrate W when the example projection grating 304 is used. For ease of illustration the radiation lines 514 have been shown having a rectangular shape corresponding to the projection grating lines 504. It will be appreciated that the shape of the radiation lines 514 shown in FIG. 5*b* does not correspond to the radiation beam 306*a*** having an angle of incidence in the typical range of between 70 degrees and 80 degrees (inclusive).

The radiation beam **306*a* is reflected by the surface of the substrate W at the measurement location and a reflected radiation beam 306*b* is directed towards the detection unit 350. The detection unit 350 comprises a detection grating 354, a detector 356, and a processing unit 360**.

The detection grating 354 is arranged to receive the reflected radiation beam **306*b*. The detection grating is preferably substantially the same as projection grating 304 and is sub-divided to correspond to the spot-array pattern. Thus, detection grating 354 comprises one or more detection grating spots, each of the detection grating spots having a plurality of detection grating lines. The detection grating lines allow a reflected radiation beam 306*b* to pass through the detection grating 354 towards the detector 356**.

FIG. 4 illustrates a detection grating 354 comprising a single detection grating spot having three detection grating lines which pass the reflected radiation beam **306*b* towards the detector 356. It will be appreciated that three detection grating lines is merely an example and a detection grating spot can have two or more detection grating lines. Furthermore the detection grating 354 may comprise multiple detection grating spots each having a plurality of detection grating lines which pass a respective reflected radiation beam towards the detector 356**.

Figure 5C:
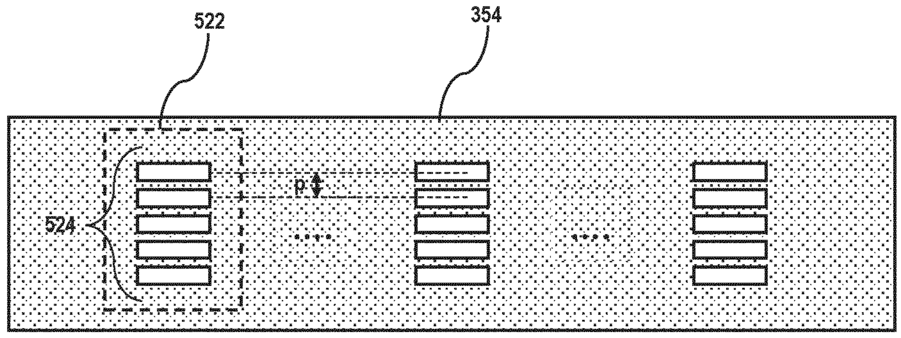
FIG. 5*c* illustrates an example detection grating.

FIG. **5*c* illustrates an example detection grating 354. In the example shown in FIG. 5*c*, the detection grating 354 comprises three detection grating spots 522. Each of the three detection grating spots comprise five detection grating lines 524**. The five detection grating lines are separated by a pitch "p" which defines the periodicity of the detection grating lines.

In practice, the level sensor LS will typically include further optical elements along the path between the substrate W and the detection grating 354. These further optical elements have been omitted from FIG. 4 for ease of illustration.

The detector 356 is configured to output an output signal to the controller 360. The detector 356 may produce a detector output signal indicative of the light received, for example indicative of the intensity of the light received and as such may comprise a photodetector. The detector 356 may alternatively be representative of a spatial distribution of the intensity received and as such may comprise a camera. The detector DET may comprise any combination of one or more detector types. For each detection grating spot 522, the detector 356 may comprise an optical sensor (or multiple optical sensors) for sensing the reflected radiation beam passing through the respective detection grating spot 522. The optical sensor may be a photodiode or any other photosensitive sensor. In contrast to known techniques, the detector 356 does not comprise an optical detector for sensing a capture spot radiation beam after reflection on the substrate.

As will be explained in more detail below, the voltage level of the output signal corresponds to the intensity of radiation sensed by the detector 356. In accordance with embodiments of the invention, the controller 360 is configured to process the output signal that it receives from the detector 356 to determine when the substrate W is positioned at a focus plane of the level sensor LS. The controller 360 is configured to control a height of the substrate W relative to a reference height in a direction perpendicular to the surface of the substrate W during a time window in which the output signal is obtained. That is, during the time window in which the output signal is obtained the substrate W is moved upwards (in the z-direction shown in FIG. 4) away from the reference height. The substrate may be a wafer supported by a wafer stage (WS). In these embodiments, the controller 360 is configured to raise (and lower) the wafer stage by communicating with an actuator (e.g. a Lorentz actuator) that controls movement of the WS.

The functionality of the controller 360 may be implemented in code (software) stored on a memory comprising one or more storage media, and arranged for execution on a processor comprising on or more processing units. The code is configured so as when fetched from the memory and executed on the processor to perform operations in line with embodiments discussed below. Alternatively it is not excluded that some or all of the functionality of the controller 360 is implemented in dedicated hardware circuitry, or configurable hardware circuitry like an FPGA.

We refer herein to a substrate W being at a focus plane of the level sensor LS when all of the radiation lines 514 are detected by the detector 356 (all of the radiation that created the radiation lines 514 is reflected by the surface of the substrate W and passes through the detection grating lines 524 of the detection grating spot 522). It will be appreciated that when substrates such as wafers are produced, their thickness can vary. Thus when a wafer W is placed onto a wafer stage WS in a lithographic apparatus LA, due to the thickness variations, it cannot be guaranteed that a surface of the wafer will be at the same height above a reference height as a previous wafer placed on the wafer stage WS. Embodiments of the present invention enable each substrate to be accurately positioned at a focus plane of the level sensor LS.

Figure 7A:
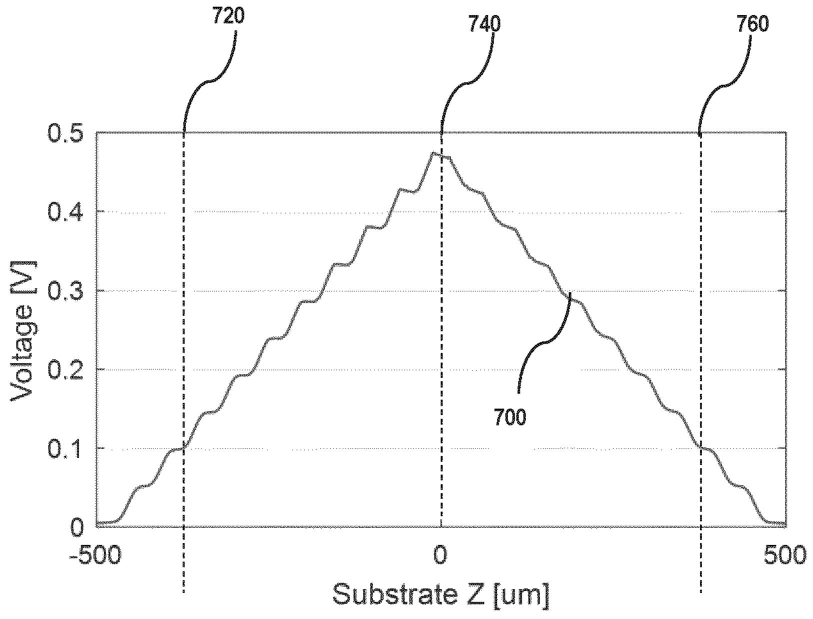
FIG. 7*a* illustrates an example output signal of a detector.

FIG. 6*a* illustrates a scenario 600 in which no reflected radiation is being detected by the detector 356 through the detection grating lines 524. In this scenario the voltage level of the output signal that is output by the detector 356 is zero. An example output signal 700 is shown in FIG. 7*a*.

FIG. 6*b* illustrates a scenario 620 in which the substrate W has been moved upwards (in the positive z-direction) relative to scenario 600 which has caused some of the radiation lines 514 to overlap with the detection grating lines 524. In this scenario the voltage level of the output signal 700 that is output by the detector 356 has increased but is not at a maximum. FIG. 7*a* illustrates the voltage output in scenario 620 by way of the dashed line 720. The voltage level of the output signal 700 that is output by the detector 356 is not at a maximum because not all of the radiation lines 514 are overlapping the detection grating lines 524. The circle 602 in FIG. 6*b* shows that two of the radiation lines 514 do not overlap with the detection grating lines 524.

FIG. 6*c* illustrates a scenario 640 in which the substrate W has been moved further upwards (in the positive z-direction) relative to scenario 620 which has caused all of the radiation lines 514 to fully overlap with all of the detection grating lines 524. In this scenario the voltage level of the output signal 700 that is output by the detector 356 has increased to a maximum. FIG. 7*a* illustrates the voltage output in scenario 640 by way of the dashed line 740. Here the substrate W is at the correct MS period referred to above.

FIG. 6*d* illustrates a scenario 660 in which the substrate W has been moved further upwards (in the positive z-direction) relative to scenario 640 which has caused some of the radiation lines 514 to no longer overlap with the detection grating lines 524. In this scenario the voltage level of the output signal 700 that is output by the detector 356 has decreased but is not at zero (some of the radiation lines 514 still overlap with the detection grating lines 524). FIG. 7*a* illustrates the voltage output in scenario 660 by way of the dashed line 760. The voltage level of the output signal 700 that is output by the detector 356 is not at a maximum because not all of the radiation lines 514 are overlapping the detection grating lines 524. The circle 604 shows that two of the radiation lines 514 do not overlap with the detection grating lines 524.

As the substrate W is moved upwards in the positive z-direction the output signal 700 is supplied to the controller 360 for processing. As shown in FIG. 7*a*, the output signal 700 comprises a plurality of periodic components with the increasing voltage steps corresponding to more radiation lines being detected by the detector 356 as the substrate moves upwards and approaches the focus plane, and the decreasing voltage steps corresponding to less radiation lines being detected by the detector 356 as the substrate moves upwards and away from the focus plane. The period of the periodic components is dependent on the angle of incidence of the radiation beam 306*a* and the pitch 'p' of the projection grating lines.

Figure 7B:
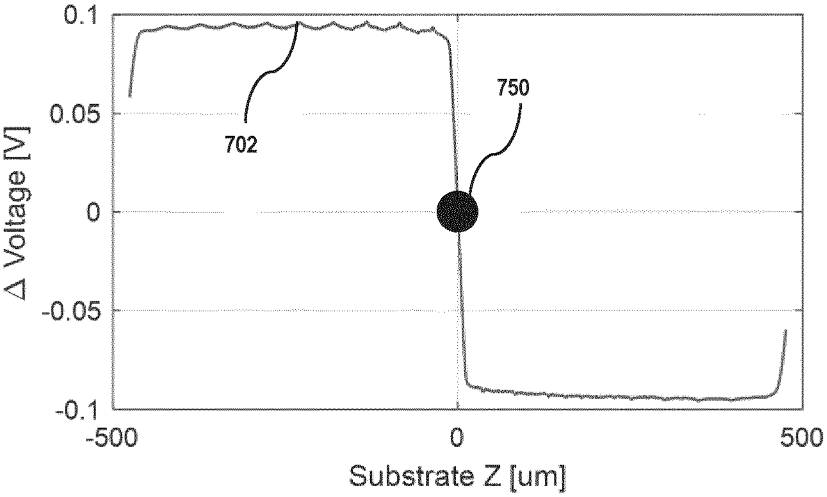
FIG. 7*b* illustrates an example derivative signal.

The controller 360 is configured to calculate a derivative of two points at different locations of the output signal 700 (wherein the two points are separated by a period of the periodic components) to obtain a derivative signal 702 shown in FIG. 7*b*. Two points one period apart share a robust condition: one additional radiation line is detected (or not) regardless of its intensity. Therefore when calculating the derivative of the two points separated by one period, the derivative changes sign (from positive to negative) when all of the radiation lines 514 fully overlap with all of the detection grating lines 524 and the substrate is positioned at the focus plane. FIG. 7*b* illustrates the derivative changing sign at the focus plane position (defined as the substrate being at Z=0). The controller 360 is configured to determine a focus plane of the level sensor when the derivative changes sign.

The process may be performed dynamically in that controller 360 may obtain the derivative signal 702 and detect when the derivative signal changes sign as the substrate W is moved upwards in the positive z-direction. Upon detecting when the derivative changes sign, the controller 360 may prevent any further upward movement of the substrate such that the substrate W is retained at the focus plane of the level sensor.

Alternatively, the controller 360 may process the output signal 700 after a scan has been performed in which the substrate is moved upwards (in the z-direction shown in FIG. 4) above the reference height. The controller 360 can then subsequently control the substrate W to be at the determined focus plane.

Figure 8:
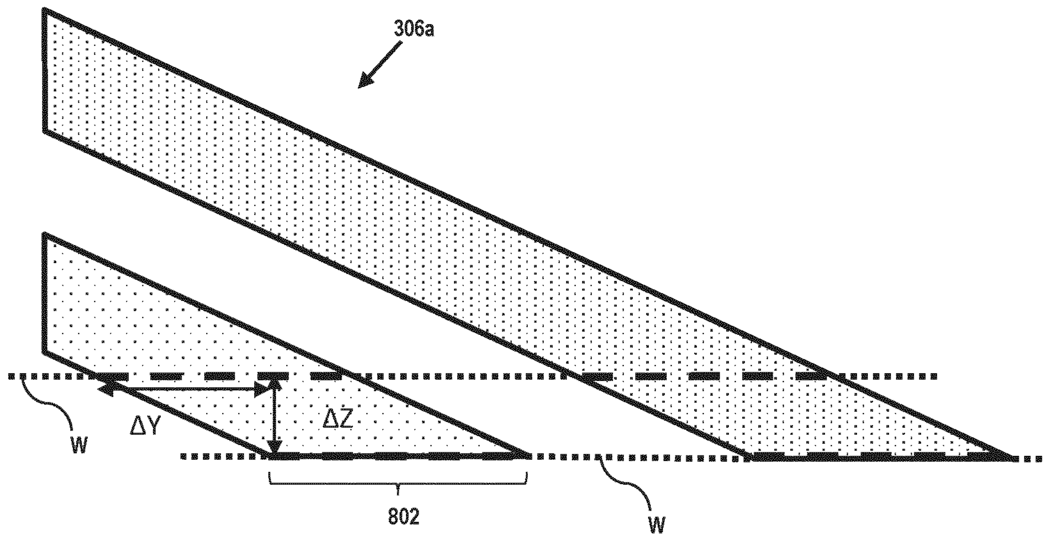
FIG. 8 illustrates diagonal scanning of the substrate.

During the time window in which the output signal 700 is obtained the substrate W may be shifted in the y-direction while scanning is being performed in the z-direction so that the same area on the substrate W is illuminated (the substrate is scanned diagonally), this is illustrated in FIG. 8. In particular FIG. 8 illustrates a component of the radiation beam 306*a* being incident on an area 802 of the surface of the substrate W when the substrate W is at a first position, and the same area 802 of the surface of the substrate W being illuminated after the substrate W has been moved upwards (in the z-direction) and shifted across (in the y-direction) to a second position.

Although specific reference may be made in this text to the substrate being a wafer, embodiments extend to measuring a position of a surface of substrates other than wafers.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "substrate" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC (stack), so that the term substrate and substrate surface used herein may also refer to a substrate that already contains multiple processed layers, and the respective surface of those layers.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below. Other aspects of the invention are set out as in the following numbered clauses:

1. A height measurement sensor for measuring a position of a surface of a substrate comprising:
   - a projection unit, wherein the projection unit comprises:
     - a radiation source;
     - a projection grating comprising a projection grating spot, the projection grating spot comprising a plurality of projection grating lines, the projection grating arranged to receive radiation emitted by the radiation source and output a radiation beam onto the surface to create a radiation spot on the surface, the radiation spot comprising a plurality of radiation lines; and
   - a detection unit, wherein the detection unit comprises:
     - a detection grating, wherein the detection grating comprises a detection grating spot, the detection grating spot comprising a plurality of detection grating lines;
     - a detector arranged to receive a reflected radiation beam comprising radiation from the radiation spot reflected from the surface after passing through the detection grating spot; and
     - a controller configured to (i) obtain an output signal of the detector, wherein the output signal comprises a plurality of periodic components; (ii) take a derivative of two points at different locations of the output signal, wherein the two points are separated by a period of the periodic components, and (iii) determine a focus plane of the height measurement sensor when the derivative changes sign.
2. The height measurement sensor of clause 1, wherein the projection grating spot has a total number of projection grating lines, and the detection grating spot has said total number of detection grating lines.
3. The height measurement sensor of clause 1 or 2, wherein the projection grating comprises a plurality of projection grating spots, each of the plurality of projection grating spots comprising a plurality of projection grating lines, and the projection grating outputs the radiation beam to create a plurality of radiation spots on the surface, each of the plurality of radiation spots comprising a plurality of radiation lines.
4. The height measurement sensor of any preceding clause, wherein the detection grating comprises a plurality of detection grating spots, each of the plurality of detection grating spots comprising a plurality of detection grating lines.
5. The height measurement sensor of any preceding clause, wherein the controller is configured to control a height of the substrate relative to a reference height in a direction perpendicular to the surface of the substrate during a time window in which the output signal is obtained.
6. The height measurement sensor of any preceding clause, wherein the controller is able to control the height of the substrate relative to the reference height within a height range, and the controller is configured, during said time window, to control the height of the substrate relative to the reference height within a subportion of said height range.
7. The height measurement sensor of clause 5 or 6, wherein the controller is configured to move the substrate in a direction perpendicular to the plurality of radiation lines during the time window in which the output signal is obtained.
8. The height measurement sensor of any preceding clause, wherein at the focus plane of the height measurement sensor, all of the plurality of radiation lines of the radiation spot created by the projection grating are detected by the detector.
9. The height measurement sensor of any preceding clause, wherein the detector comprises an optical sensor for sensing the reflected radiation beam passing through the detection grating spot.
10. The height measurement sensor of clause 9, wherein the optical sensor is a photodiode.

11. The height measurement sensor of any preceding clause, wherein the period of the periodic components is dependent on an angle of incidence of the radiation beam and a periodicity of the projection grating lines.
12. The height measurement sensor of any preceding clause, wherein the radiation emitted by the radiation source has a wavelength in the range of 600 nm-1050 nm.
13. The height measurement sensor of any of clauses 1 to 11, wherein the radiation emitted by the radiation source is has a wavelength in the range of 100 nm-400 nm.
14. A lithographic apparatus comprising the height measurement sensor of any preceding clause.
15. An assessment system comprising the height measurement sensor of any of clauses 1-13.
16. A metrology system comprising the height measurement sensor of any of clauses 1-13.
17. A method for determining a focus plane of a height measurement sensor, the method comprising:
emitting, with a radiation source of the height measurement sensor, radiation onto a projection grating of the height measurement sensor, the projection grating comprising a projection grating spot, the projection grating spot comprising a plurality of projection grating lines, the projection grating arranged to output a radiation beam onto a surface of a substrate to create a radiation spot on the surface, the radiation spot comprising a plurality of radiation lines;
receiving, with a detector of the height measurement sensor, a reflected radiation beam comprising radiation from the radiation spot reflected from the surface after passing through a detection grating spot of a detection grating, the detection grating spot comprising a plurality of detection grating lines; and
a controller of the height measurement sensor (i) obtaining an output signal of the detector, wherein the output signal comprises a plurality of periodic components; (ii) taking a derivative of two points at different locations of the output signal, wherein the two points are separated by a period of the periodic components, and (iii) determining the focus plane of the height measurement sensor when the derivative changes sign.

The invention claimed is:

1. A height measurement sensor comprising:
a projection unit, wherein the projection unit comprises:
a radiation source;
a projection grating comprising a projection grating spot, the projection grating spot comprising a plurality of projection grating lines, the projection grating arranged to receive radiation emitted by the radiation source and output a radiation beam onto a surface of a substrate to create a radiation spot on the surface, the radiation spot comprising a plurality of radiation lines; and
a detection unit, wherein the detection unit comprises:
a detection grating, wherein the detection grating comprises a detection grating spot, the detection grating spot comprising a plurality of detection grating lines;
a detector arranged to receive a reflected radiation beam comprising radiation from the radiation spot reflected from the surface after passing through the detection grating spot; and
a controller configured to:
obtain an output signal of the detector, wherein the output signal comprises a plurality of periodic components;
take a derivative of two points at different locations of the output signal, wherein the two points are separated by a period of the periodic components, and
determine a focus plane of the height measurement sensor in response to the derivative changing sign.

2. The height measurement sensor of claim 1, wherein:
the projection grating spot has a total number of projection grating lines, and
the detection grating spot has the total number of detection grating lines.

3. The height measurement sensor of claim 1, wherein:
the projection grating comprises a plurality of projection grating spots, each of the plurality of projection grating spots comprising a plurality of projection grating lines, and
the projection grating outputs the radiation beam to create a plurality of radiation spots on the surface, each of the plurality of radiation spots comprising a plurality of radiation lines.

4. The height measurement sensor of claim 1, wherein the detection grating comprises a plurality of detection grating spots, each of the plurality of detection grating spots comprising a plurality of detection grating lines.

5. The height measurement sensor of claim 1, wherein the controller is configured to control a height of the substrate relative to a reference height in a direction perpendicular to the surface of the substrate during a time window in which the output signal is obtained.

6. The height measurement sensor of claim 1, wherein:
the controller is able to control the height of the substrate relative to the reference height within a height range, and
the controller is configured, during the time window, to control the height of the substrate relative to the reference height within a sub-portion of the height range.

7. The height measurement sensor of 5, wherein the controller is configured to move the substrate in a direction perpendicular to the plurality of radiation lines during the time window in which the output signal is obtained.

8. The height measurement sensor of claim 1, wherein at the focus plane of the height measurement sensor all of the plurality of radiation lines of the radiation spot created by the projection grating are detected by the detector.

9. The height measurement sensor of claim 1, wherein the detector comprises an optical sensor configured to sense the reflected radiation beam passing through the detection grating spot.

10. The height measurement sensor of claim 9, wherein the optical sensor is a photodiode.

11. The height measurement sensor of claim 1, wherein the period of the periodic components is dependent on an angle of incidence of the radiation beam and a periodicity of the projection grating lines.

12. The height measurement sensor of claim 1, wherein the radiation emitted by the radiation source has a wavelength in the range of about 600 nm-1050 nm.

13. The height measurement sensor of claim 1, wherein the radiation emitted by the radiation source is has a wavelength in the range of about 100 nm-400 nm.

14. A lithographic apparatus comprising the height measurement sensor of claim 1.

15. An assessment system comprising the height measurement sensor of claim 1.

16. A metrology system comprising the height measurement sensor of claim 1.

17. A method comprising:

emitting, with a radiation source of a height measurement sensor, radiation onto a projection grating of the height measurement sensor, the projection grating comprising a projection grating spot, the projection grating spot comprising a plurality of projection grating lines, the projection grating arranged to output a radiation beam onto a surface of a substrate to create a radiation spot on the surface, the radiation spot comprising a plurality of radiation lines;

receiving, with a detector of the height measurement sensor, a reflected radiation beam comprising radiation from the radiation spot reflected from the surface after passing through a detection grating spot of a detection grating, the detection grating spot comprising a plurality of detection grating lines; and obtaining an output signal of the detector, wherein the output signal comprises a plurality of periodic components;

taking a derivative of two points at different locations of the output signal, wherein the two points are separated by a period of the periodic components, and determining the focus plane of the height measurement sensor in response to the derivative changes sign.

* * * * *